United States Patent [19]

Choi et al.

[11] Patent Number: 4,862,075

[45] Date of Patent: Aug. 29, 1989

[54] HIGH FREQUENCY TEST HEAD USING ELECTRO-OPTICS

[75] Inventors: Hee-June Choi, Fremont; Francois J. Henley, San Jose; Maurice R. Barr, Saratoga, all of Calif.

[73] Assignee: Photon Dynamics, Inc., San Jose, Calif.

[21] Appl. No.: 240,016

[22] Filed: Sep. 1, 1988

[51] Int. Cl.$^4$ .................. G01R 19/00; G01R 5/28
[52] U.S. Cl. ...................... 324/158 F; 324/73 PC; 324/158 R; 324/96; 324/158 D
[58] Field of Search .......... 324/73 AT, 158 F, 158 P, 324/73 PC, 158 R, 158 D, 96, 77 K; 356/244, 243, 239, 397; 437/8; 350/390, 331 R

[56] References Cited

U.S. PATENT DOCUMENTS 4,465,969 8/1984 Tada et al. ........................ 324/96 X
4,554,449 11/1985 Taniuchi et al. ................. 324/96 X
4,556,317 12/1985 Sandland et al. ................... 356/239

Primary Examiner—Reinhard J. Eisenzopf
Assistant Examiner—Vinh P. Nguyen
Attorney, Agent, or Firm—Flehr, Hohbach, Test, Albritton & Herbert

[57] ABSTRACT

A high speed test system for performing tests on various electrical devices including integrated circuits and semiconductor wafers at device operating speeds in the Gigahertz range. The test system including a test head having a test platform for receiving an adapter board that holds the device under test. The test platform is exposed on one side of the test head to facilitate readily changing the tested devices and easy coupling with conventional wafer prober machines. A plurality of pin driver boards are positioned radially about the test platform to minimize the distance between the device under test and the pin driver boards. Electrical signals presented at specific locations on the device under test are measured in response to the inputted signals form the pin drivers using an electro-optic sensor preferably located central of the pin driver boards and within 1.0 cm of the device under test to minimize pin capacitance. A cooling system is provided to maintain the pin drivers at a substantially constant temperature during operation to minimize pin driver timing drift. An optical system directs light towards the electro-optic sensor through an optical path located centrally of the pin driver boards.

23 Claims, 7 Drawing Sheets

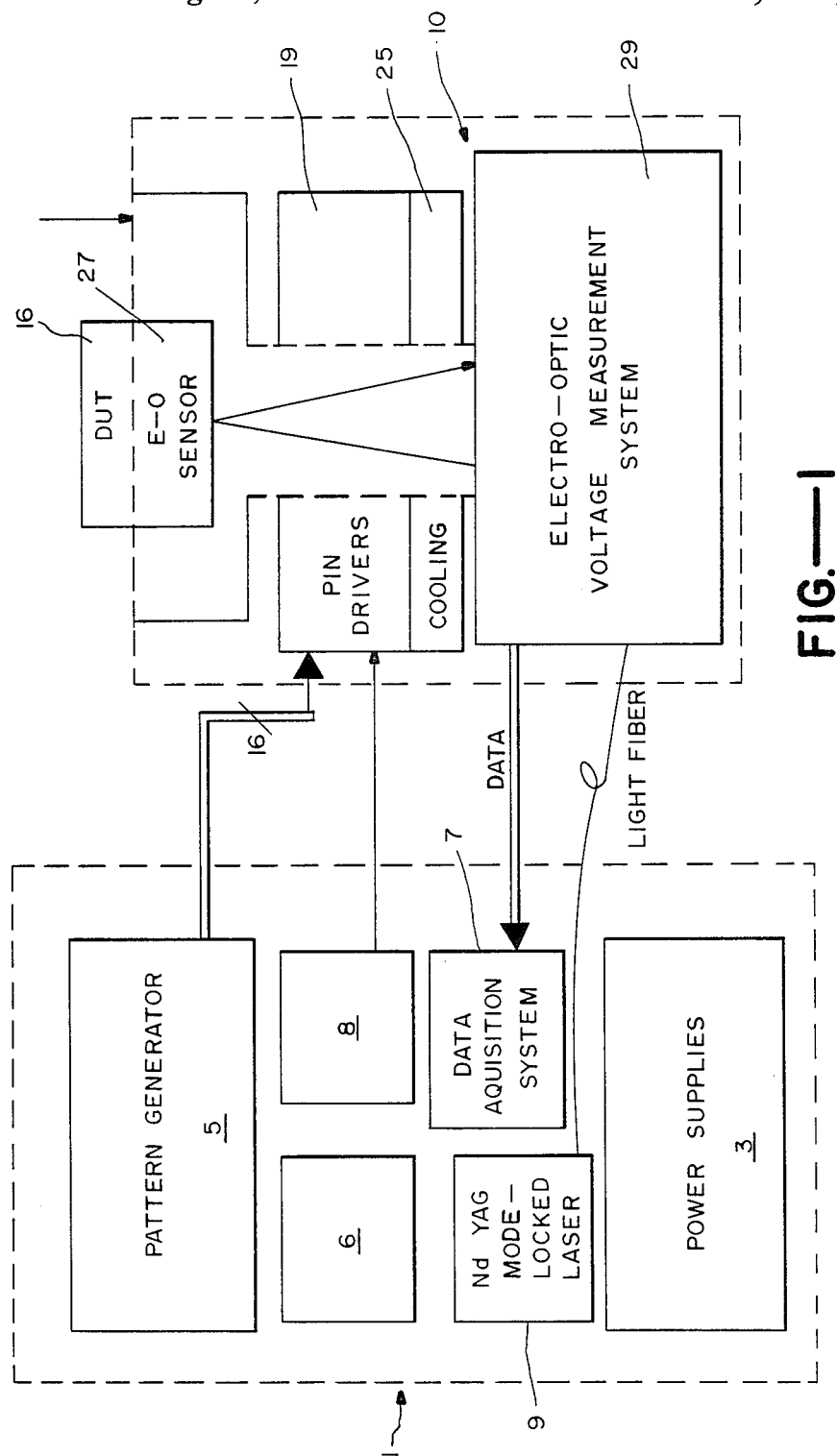
FIG.—1

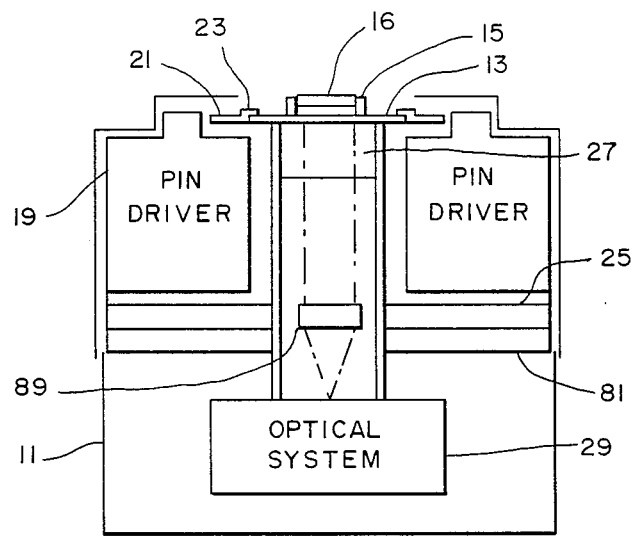
FIG.—2
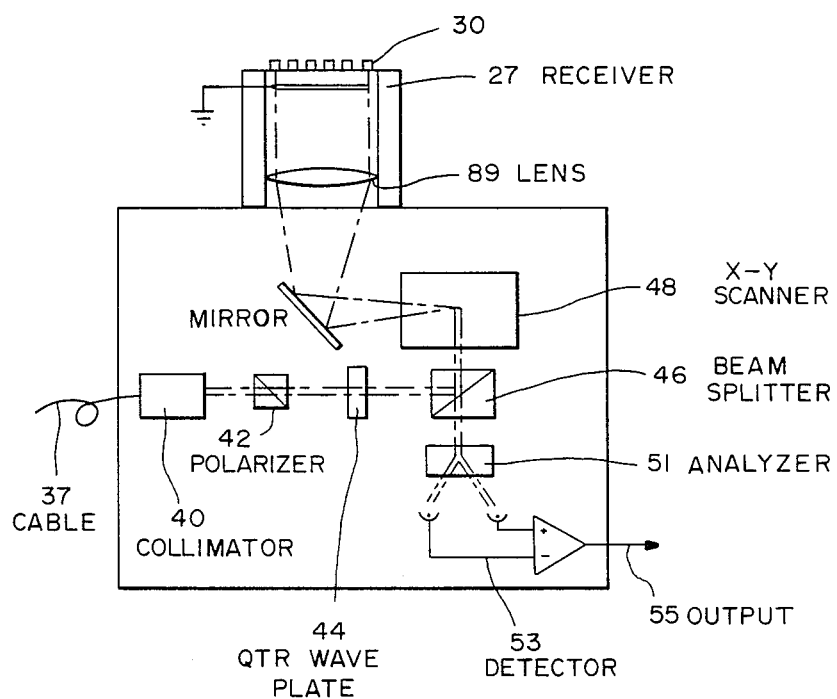
FIG.—5

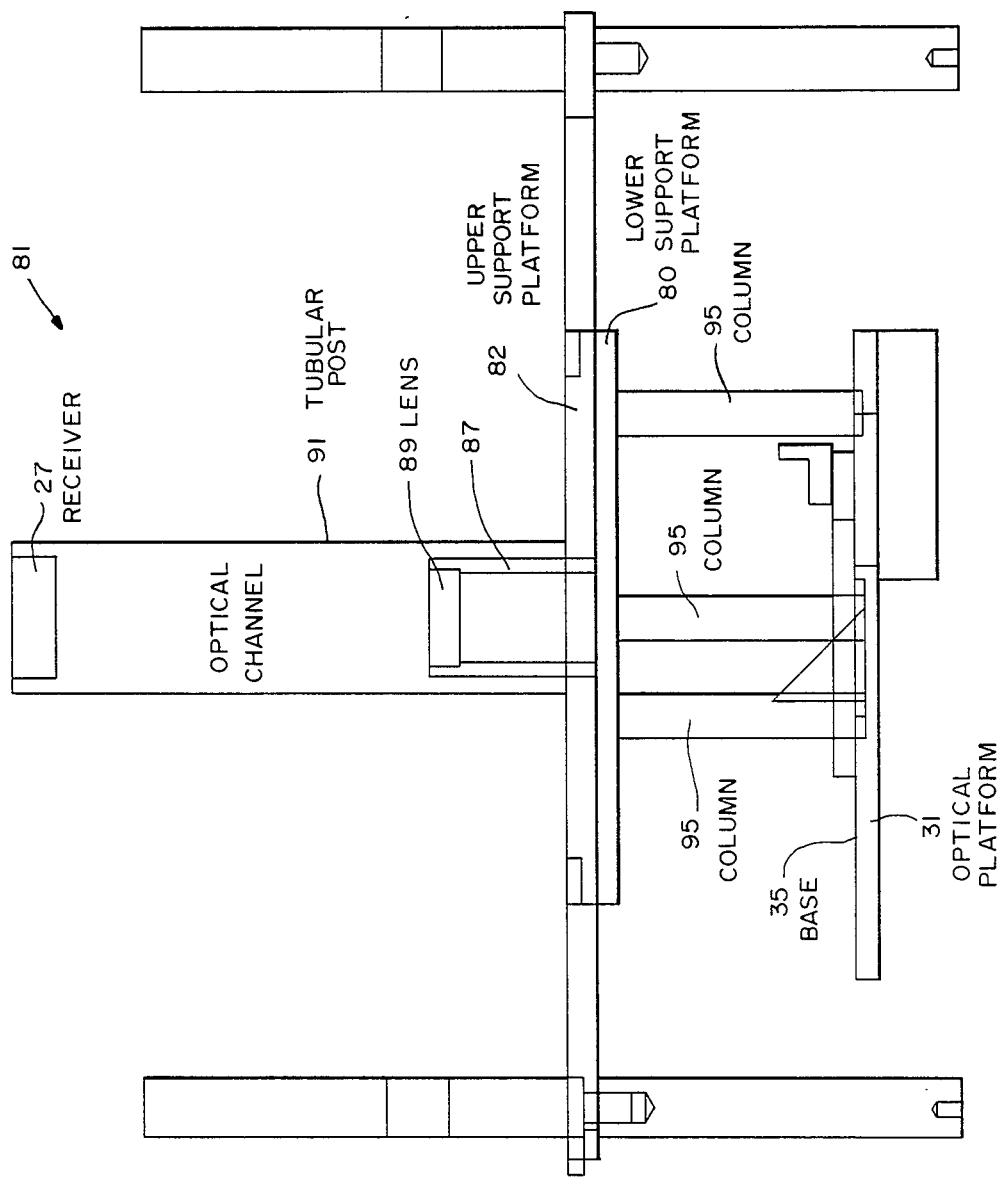
FIG.—3

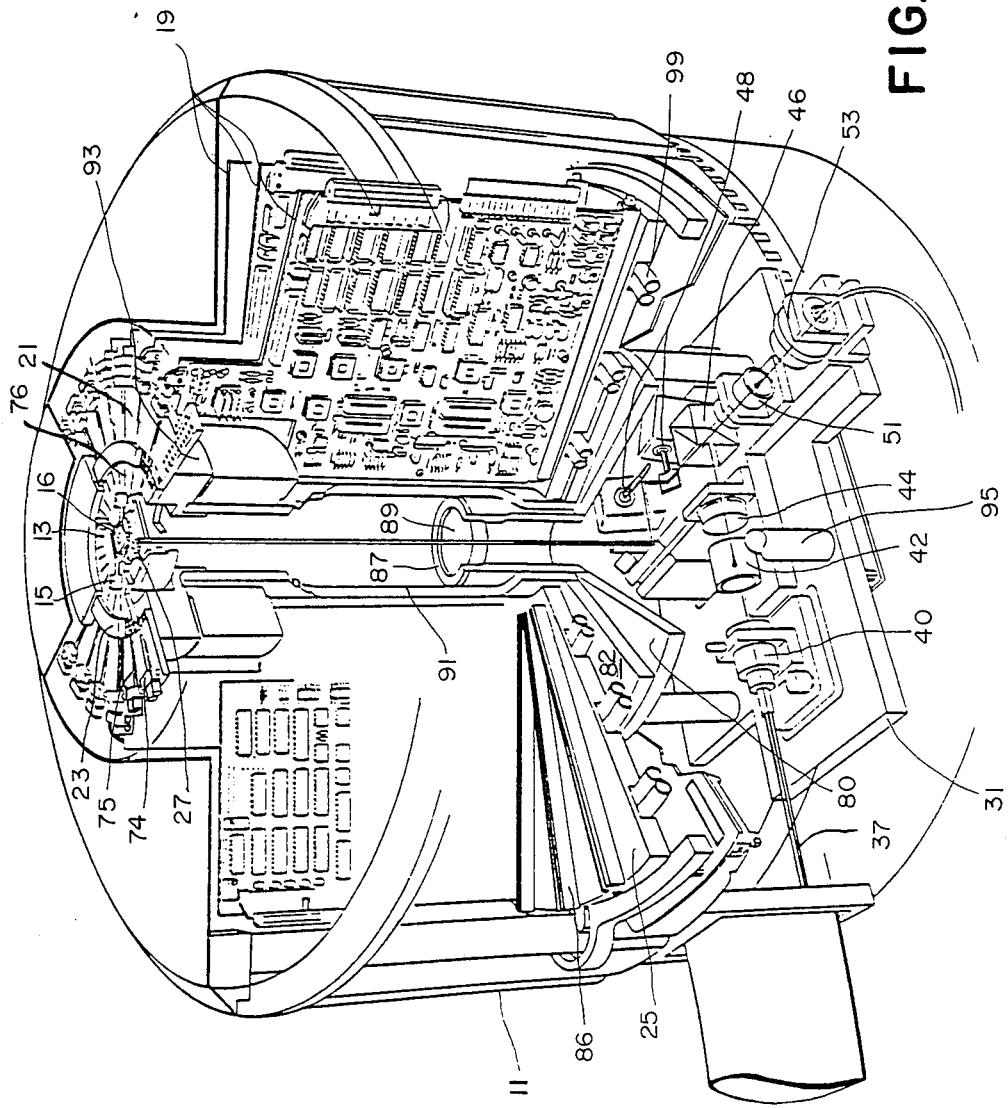
FIG.—4

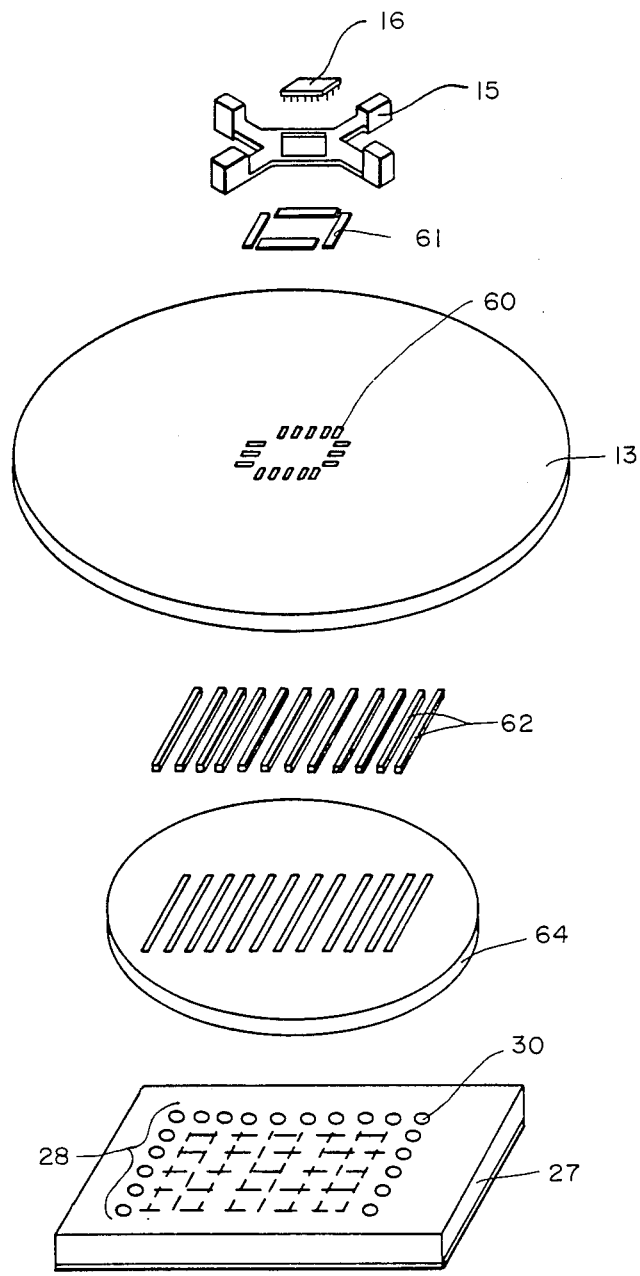
FIG.—6

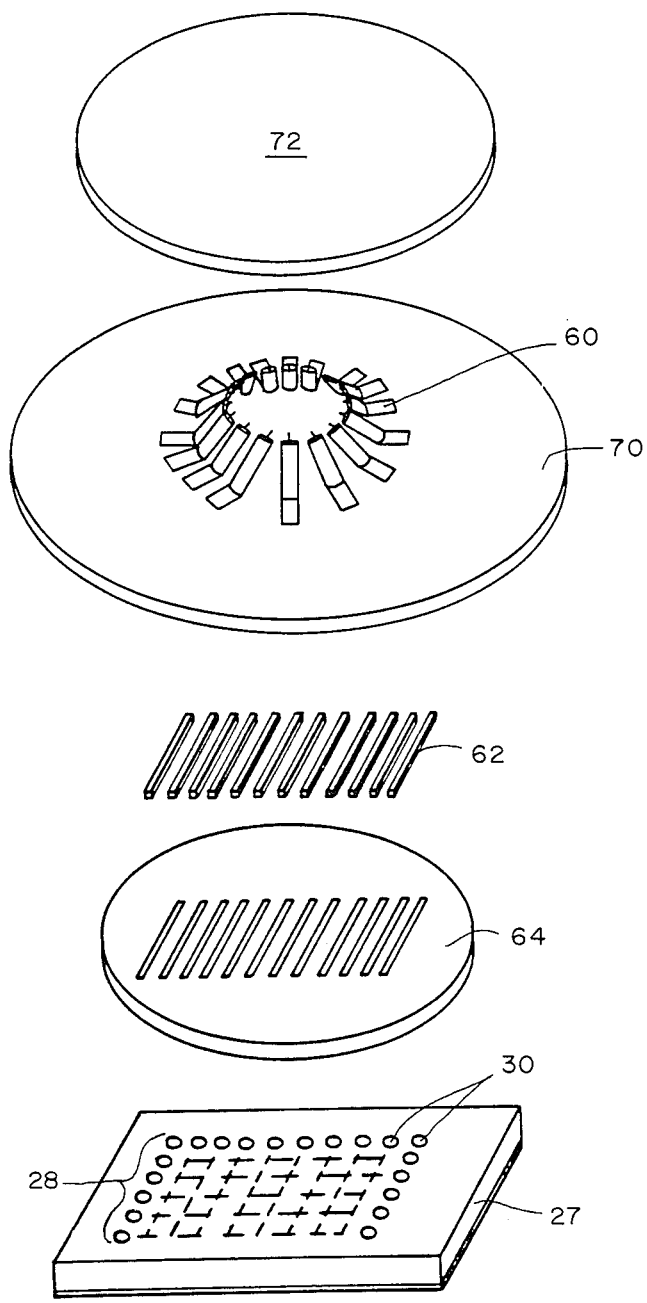
FIG.—7

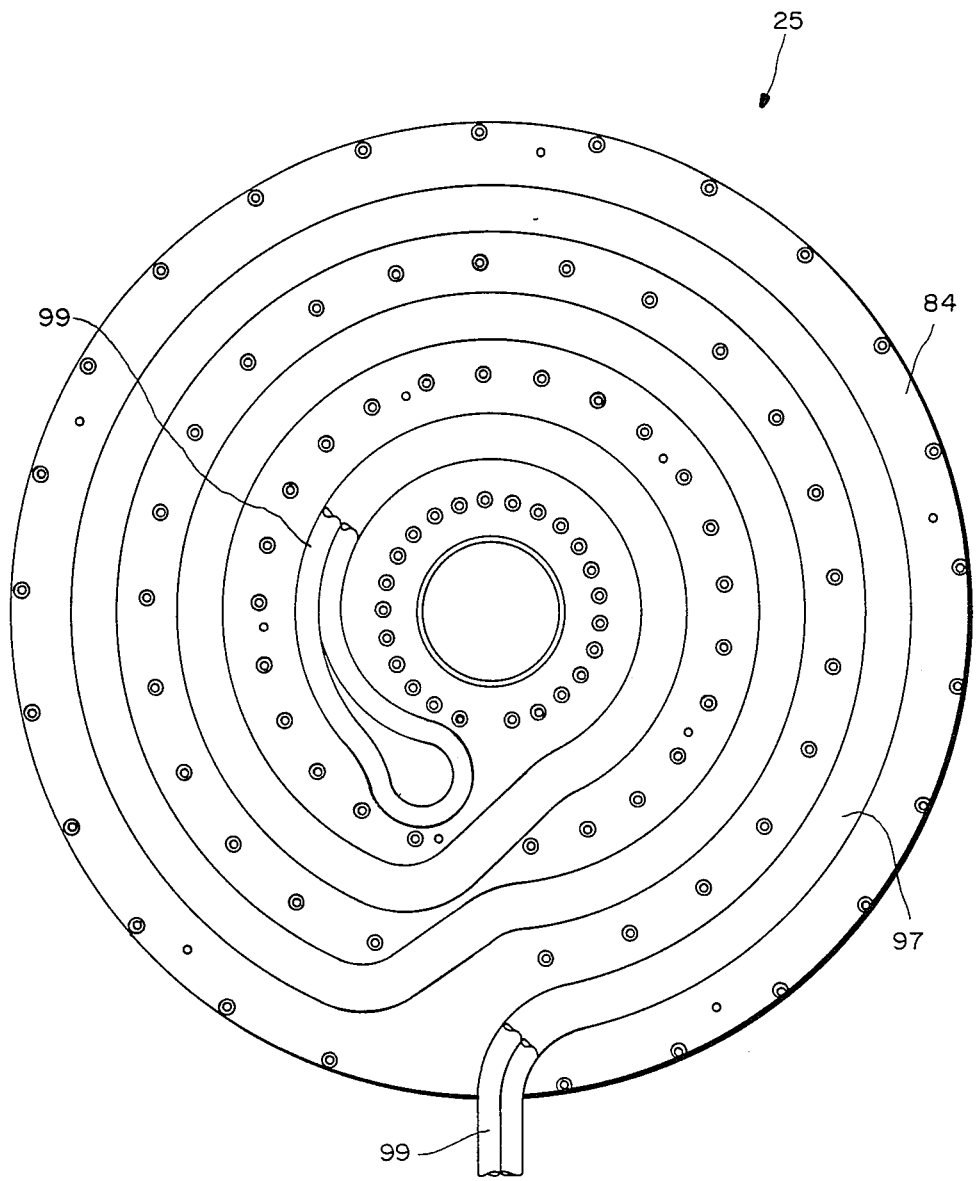
FIG.—8

HIGH FREQUENCY TEST HEAD USING ELECTRO-OPTICS

This present invention relates generally to an automatic test system for testing electrical circuits. More particularly, the invention relates to a novel test head design that incorporates a high speed electro-optic receiver to test devices operating in the hundreds of megahertz to gigahertz range. The invention is related to several co-pending applications including co-pending application Ser. Nos. 239,577, (ULTRA-HIGH SPEED DIGITAL TEST SYSTEM USING ELECTRO-OPTIC SIGNAL (ELECTRO-OPTIC SAMPLING SYSTEM CLOCK AND STIMULUS PATTERN GENERATOR) and 239,585 (ELECTRO-OPTIC SAMPLING SYSTEM WITH INDIVIDUAL PULSE MEASUREMENT AND VOLTAGE CALIBRATION), each filed Sept. 1, 1988, which are incorporated herein by reference.

BACKGROUND OF THE INVENTION

Conventional automatic test equipment (ATE) systems and ATE technology are inadequate to test high-speed integrated circuits including silicon bipolar emitter-coupled logic circuits, gallium arsenide circuits, and high-speed CMOS/NMOS circuits. The present state of the art in test-system technology has maximum data rates running up to 200 MHz. The difficulties in raising this test rate limit are largely due to limitations in the receiver technology, as well as measurement and signal routing which degrade the signals to the point of causing inaccuracies in the measurement system.

A suitable test system must meet stringent requirements in throughput, pin count, voltage and time accuracy, and must be general-purpose enough to accommodate a particular manufacturer's present and future device types. The test system must also perform DC and AC parametric, have flexible real-time branching "on the fly," and support many different waveform formats. Lastly, the test system must have a comprehensive software package to assist the manufacturer in developing his own test programs.

In spite of all of these requirements, until recently, test systems have kept pace with device requirements. At the 10 Mhz clock rates of over ten years ago, the manufacturers of test systems were able to cope. Even at 20 MHz and up to 120 pins, cost effective systems were built (e.g. the Fairchild Sentry 20). However, the push to 40 or 50 MHz and beyond has been more difficult. Most conventional LSI/VLSI test system are complex electro-mechanical assemblies and substantial technical obstacles stand in the way of developing and manufacturing significantly faster test systems.

Accommodating all of the features of a general test system has previously required that substantial capacitance be seen by the interrogated pin on the device under test. Present VLSI testers have pin capacitances from a low of 22 pF to 100 pF or more. This capacitance is difficult to reduce and can cause major accuracy problems in testing MOS circuits. For high-speed testing, pin capacitance is a major consideration and should be kept below 5 pF.

The high pin counts of numerous modern devices have required that a large number of complex electronic assemblies be placed near the device under test. Conventional test heads have the necessary resources to inject complex tri-state test waveforms to the device under test, power the device, and measure its output waveforms. Because of the amount of electronics required, the distance between the pins on the device under test and the receiver that measures the output signals are forced to be as long as 50 cm through a series of connectors. With such an arrangement, high-speed signal fidelity suffers which reduces the available bandwidth of the test system. Changing device impedances during switching also degrades total measurement performance irrespective of any controlled impedance paths to the receiver.

To eliminate reflection problems, the receiver must be placed in close proximity to the device under test. Specifically, the receiver should be disposed within a distance corresponding to a quarter wavelength of the highest frequency of interest. By way of example, for a receiver bandwidth of 5 GHz into 50 ohms, the maximum pin-to-receiver distance is approximately 0.5 cm, creating very difficult mechanical and cooling problems.

Therefore, there is a need for a test system that is capable of working with a wide variety of electronic devices at extremely high speeds including devices that operate in the range of 200 MHz to several gigahertz.

SUMMARY OF THE INVENTION

Accordingly, it is a primary objective of the present invention to provide a test system capable of testing electrical devices that operate at very high frequencies.

Another objective is to provide a test system that is capable of testing a wide variety of devices including integrated circuits, semiconductor wafers, printed circuits, hybrid systems and modules.

Another objective of the invention is to provide a test system that may conveniently interface with production test systems.

Another objective of the invention is to provide a test system wherein the distances between a device under test and the receiver is reduced.

Another objective of the invention is to provide a test system in which pin capacitance of the device under test is minimized.

Another objective is to provide a test system that has good temperature stability for its driving circuits to preserve high frequency operation.

To achieve the foregoing and other objects and in accordance with the purpose of the present invention, a high speed test system is provided that measures electrical properties of various devices. The test system includes a test head having a test platform for receiving an adapter board that couples the device under test to the test head. The test platform are arranged to facilitate easy removal and replacement of the adapter board and coupling the test head to various devices. A plurality of pin driver boards, preferably disposed radially about the test platform provide high frequency electrical signals to the device under test for causing the device under test to perform particular tasks. The pin driver boards are radially arranged to minimize the distance that signals must travel to the device under test. A receiver measures the electrical signals presented at specific locations on the device under test in response to the signals inputted from the pin driver boards. The receiver includes an electrooptic electrical field applied thereto, and an optical system for directing light towards the electro-optic sensor. The electro-optic sensor is disposed adjacent the adapter board. Preferably, the electro-optic sensor and the optical system are located central of the pin driver boards.

In a preferred embodiment, the electro-optic sensor is located within 1.0 cm of the device under test to minimize pin capacitance, and the pin capacitance of the receiver is maintained at less than 5 picofarads. More preferably, the pin capacitance is less than 0.5 picofarads.

The pin driver boards are located radially about the test platform to minimize the distance between the device under test and the pin driver boards. Each pin driver board has an associated electrical transmission channel that transmits electrical signals from the driver board through an electrical contact associated with a particular contact point on the device under test and thereafter to ground. The transmission channels preferably have substantially equal impedance to maintain signal integrity. The impedance of the matched transmission channel are less than approximately 100 ohms.

In yet another preferred embodiment, a cooling system is provided for maintaining the pin driver boards at a substantially constant temperature during operation to minimize pin driver timing drift. The test system described is capable of testing devices under operation at frequencies higher than 500 MHz.

BRIEF DESCRIPTION OF THE DRAWINGS

The features of the present invention that are believed to be novel are set forth with particularity in the appended claims. The invention, together with further objects and advantages thereof, may best be understood by reference to the following description taken in conjunction with the accompanying drawings in which:

FIG. 1 is a schematic block diagram of a test system that incorporates the test head of the present invention.

FIG. 2 is a schematic cross sectional view of a test head built in accordance with the present invention.

FIG. 3 is a diagrammatic side view of a frame and optical support platform.

FIG. 4 is a diagrammatic perspective view of the test head.

FIG. 5 is a schematic diagram of the optical path of the test head electro-optic voltage measurement system.

FIG. 6 is a diagrammatic exploded view of the interconnection between an integrated circuit chip as the device under test and the electro-optic receiver.

FIG. 7 is a diagrammatic exploded view of the interconnection between a semiconductor wafer as the device under test and the electro-optic receiver.

FIG. 8 is a diagrammatic bottom view of the cooling plate.

DETAILED DESCRIPTION OF THE DRAWINGS

Referring initially to FIG. 1, the embodiment of the test system chosen for the purpose of illustration is separated into two distinct units. Specifically, there is a stationary main unit 1 that houses the power supplies 3, pulse generator 5, controller 6, data acquisition systems 7, DUT power supplies 8, and the laser source 9. Additionally, there is a separate test head 10 that is easily maneuverable. The test head may also be mounted on a 6 axis manipulator (not shown) to facilitate orientation in any direction for use in particular applications. For example, the test head is specifically arranged so that when inverted it can mate with conventional ring carrier wafer probers.

Referring primarily to FIG. 2, the embodiment of the test head 10 of the present invention chosen for the purposes of illustration includes an adapter board 13 having a socket 15 for receiving a device under test 16. A multiplicity of electronic boards are provided to drive the device under test. The electronic boards include a plurality of pin driver boards 19, at least one clock board and a power distribution board. A test platform 21 is electrically coupled to the electronic boards and connects the adapter board 13. An elastomeric connector ring 23 electronically couples the test platform electronics to the adapter board 13. A liquid cooling system 25 maintains the electronic boards at a consistent temperature. The signals at specific locations on the device under test are measured by an electro-optic voltage measuring system that includes elertro-optic receiver 27 and optical system 29. The optical system 29 optically communicates with the electro-optic receiver 27 and is supported by a stable optical platform 31.

The test head is arranged with the adapter board and the electro-optic receiver on one end or side and the majority of the optical system components on the opposite end or side. An optical channel that extends along the longitudinal axis of the test head connects the two. The adapter board 13 is disposed on the top surface of the test head, which provides ready access and facilitates coupling the test system with conventional devices such as wafer probers, hybrid packages, printed circuit boards and modules. The test head is radially symmetrical about a central post to maintain thermal and mechanical stability of the optical mechanism. The supporting pin electronics are arranged in radial fashion about a central post to minimize and equalize the distance between the various pin driver boards 19 and the DUT 16. The central post is substantially tubular to form the aforementioned optical channel.

It is important to provide a stable optical platform for the electro-optic receiver system since mechanical vibrations will induce signal noise. Referring next to FIGS. 3 and 4, the support system 81 includes an optical platform 31 that supports the optical components, a lower support platform 80, and an upper support platform 82. A cooling plate 84 that supports a multiplicity of radially arranged electronic board connectors 86 rests on top of the upper support platform (see FIG. 4). A tubular inner post 87, forms a portion of lower support platform 80 and supports a lens 89 for directing the optical signals to the electro-optic receiver 27. A tubular outer post 91 which forms a portion of the upper support platform 82, encases the inner post 87 and supports member 93 (FIG. 4), that holds the adapter board 13. The posts 87 and 91 provide an optical channel through which the electro-optic receiver and the optical system 29 may communicate.

The lower support platform 80 is coupled to the optical platform 31 by plurality of radially arranged columns 95. In the embodiment shown in FIG. 3, four equispaced columns are used. The upper support platform 82 rests on top of the lower platform 80. The cooling plate 84 rests on top of the upper support platform 82. The cooling plate is formed of a good heat conducting material such as aluminum. Board connectors 86 are arranged radially about the cooling plate to couple the various electronic boards to the cooling plate. The pin driver boards 19 are arranged in pairs with each pair being attached to the opposite side of a conducting plate. The conducting plate couples with the board connectors 86 to firmly secure the pin driver boards in place. The conducting plates are made of a good head conducting material such as copper. The conducting plate serves to efficiently transfer heat from its associated pin driver boards to the cooling plate. Additionally, to enhance heat conduction from the various electronic components to the cooling plate 84 heat transfer plates are coupled to the top of the electronic components to provide a sandwich type arrangement that is particularly good at transferring heat towards the cooling plate 84. The heat transfer plates may also be formed from copper.

Referring primarily to FIGS. 4 and 8, the test head is cooled by a liquid cooling system which has a main function of removing heat from the high speed pin driver boards 19. To provide a uniform temperature on the cooling plate 84, a liquid coolant is passed through a spiral shaped conduit attached to the bottom of the cooling plate. Specifically, the cooling plate 84 includes a spiral channel 97 that receives a cooling tube 99. The cooling tube 99 is doubled over within the channel 97 to form an in-going conduit and an outgoing conduit as can be seen in FIG. 8. A cooling fluid having a relatively high specific heat capacity such as water is passed through the cooling tube to maintain the cooling plate at a constant temperature. With this arrangement, the temperature variations about the cooling plate are minimized since in each region the temperature of the surrounding plate is influenced by the average temperature of both the incoming and the outgoing conduits. Liquid cooling is chosen to minimize vibrations induced by the cooling system.

With the arrangement described, the temperatures of the electronics can be carefully controlled and temperature variations during use minimized by controlling the temperature of the cooling plate. It is important to minimize temperature variations within the electronics, to minimize temperature induced pin driver timing drifts.

The electronic boards include a dedicated pin driver board for each pin that can be driven by the tester. In the embodiment of the test head chosen for the purpose of illustration, 20 pin driver boards are provided, although it should be appreciated that the actual number of pins driven may be widely varied. Each pin driver board is supported by one of the board connectors 86 on its lower end and is balanced by the test platform 21 on its upper end. Each pin driver board 19 is electrically coupled to the test platform by an electrical connector 74. It is important to the operation of the tester that the driver electronics be capable at operating at the desired high speeds. In the embodiment chosen for illustration GaAs chips are used within each of the pin driver boards 19 to facilitate operation in the hundreds of megahertz to gigahertz range.

The electrical connections between the pin driver boards 19 and the device under test 16 are made over controlled impedance lines to ensure the transmission of good signals to the device under test. Specifically, the impedance of each transmission channel between the pin driver and the pins on the device under test is carefully controlled. In the embodiment chosen for the purpose of illustration, transmission line impedance is selected to be $50\pm5$ ohms. Such controlled impedance minimizes reflections which serves to preserve the integrity of the transmitted signal rise time.

The actual components controlled include electrical connector 74, test platform transmission line 75, elastomer connector ring 23, adaptor plate transmission line 76, and elastomeric connector 61. It should be appreciated that the purpose of the invention could be equally well served using a wide variety of other components, so long as the matched impedance of the selected components remain consistent between the various pin drivers and the device under test.

The optical platform 31 includes a base 35 upon which the optical components are placed. Referring to FIGS. 4 and 5, the optical path within the test head will be described. A fiber optic cable 37 carries optical signals from the laser source 9 to a fiber collimator 40. The optical signals are then directed through a linear polarizer 42, a quarter wave plate 44 that circularly polarizes the light, a nonpolarizing beam splitter 46 and an x-y scanner 48 that directs the beam towards specific points on the electro-optic receiver as described below. The electro optic receiver has an array 28 of metallic contacts 30 that may be individually scanned. The optical signal is influenced by any electrical signal present at the particular contact on the electro-optic receiver that is being scanned and is reflected by the metallic contact 30 back through the x-y scanner 48 and the beam splitter 46 to an analyzer 51 that takes the form of a Wollaston polarizer and a pair of differential detectors 53. An output cable 55 then directs the output signal back through wiring bundle 11 to the data acquisition system 7. The functions of these various optical components are described in more detail in co-pending application Ser. No. 239,577, supra.

In the embodiment chosen for illustrative purposes, the electro-optic receiver 27 is a Pockel "Cell" that has the property of elliptically polarizing the incident light beam in an amount proportional to the field intensity present inside the crystal. The receiver is fabricated form a transparent quartz crystal and has an array of electrodes spaced therein. The actual size of the electrode array 28 may be widely varied. By way of example, in the embodiment chosen for the purpose of illustration, the electrode array 28 takes the form of a 12 by 12 matrix. The X-Y scanner is arranged to direct the circularly polarized light beam towards each one of the electrodes on an individual basis. The field in the vicinity of the scanned electrode will vary in accordance with the charge on the electrode and thus, the nature of the signal applied to the scanned electrode can be determined by monitoring the elliptical polarization of the reflected light beam.

Referring next to FIG. 6, the coupling between the device under test 16 and the electro-optic receiver 27 will be described. It is important to high speed operation of the tester that the capacitance between the tester and the device pins be minimized to minimize phase shifting of the signal to facilitate high speed data measurements. Specifically to facilitate operations in the Gigahertz range, it is desirable to maintain the capacitive loading of the pins at less than 5 picofarad. More preferably, the capacitive loading is maintained at less than 0.5 picofarads.

A socket 15 receives the device under test. Dedicated adapter boards 13 are contemplated wherein each adapter board is designed to support a particular package configuration. The adapter board 13 for a particular device has a plurality of contact pads 60 for electrically contacting the respective pins on the device under test. A plurality of elastomeric connectors 61 are provided between the socket 15 and the adapter board 13 to insure good contact between the device under test and the adapter board's contact pads 60. The elastomeric connectors 61 are formed from a silicon material and are impregnated with a multiplicity of gold ribbons that will insure good electrical contact between adjacent parts. By way of example, suitable elastomeric contacts have gold ribbons with cross sectional dimensions of 2.0 by 0.5 mils and are commercially available.

The adapter board 13 includes transmission lines that transmit the pin signals from the contact pads 60 on its top surface, to a matrix of contact points on its bottom surface. The contact points (not shown) are spaced suitably to mate with the electrode array 28 on the electro-optic receiver 27. A plurality of elastomeric contacts 62 that recess within an elastomer housing 64 complete the contact between the adapter board contact points and the electrodes 30 on electro-optic receiver 27. Elastomeric contacts 62 may take the same form as the elastomeric contacts 61. The electrodes 30, within electrode array 28 must have very good conductivity and by way of example, gold makes a suitable electrode material. With the arrangement described, the electro-optic receiver is disposed very close to the device under test minimizing both the distance traveled by the electrical signals and the capacitance of the electrical system between a specific pin and the specific electrode 30 in the electro-optic receiver 27 that detects the pin signals. With the arrangement described, the receiver electrodes 30, which induce the field that is optically detected can be located in very close proximity to the actual pins (or other contact point) being tested. Indeed distances of less than a centimeter or a half of a centimeter are readily attainable. This is beneficial both to minimize pin capacitance and to preserve signal integrity.

Referring next to FIG. 7, the test head can readily be adapted to couple with conventional wafer probing systems. The adapter board 13 is replaced with a conventional wafer probe card 70 which couples to a selected semiconductor wafer 72. The wafer probe card 70 functions virtually identically to the adapter board 13 and segregates the signals from various test points on the wafer to the electrode matrix 28 on electro-optic receiver 27. The elastomer contacts 62 and elastomer housing 64 as previously described facilitate the contact between the probe card 70 and the electro-optic receiver 27.

Although only a few embodiments of the present invention have been described herein, it should be understood that the present invention may be embodied in many other specific forms without departing from the spirit or scope of the invention. For example, the electro-optic sensor has been described as using the Pockels effect. However, other electro-optic design techniques can be employed as well. For example multi-quantum well electro-absorption devices, charge sensing devices and devices employing the Franz-Kildich effect are contemplated and indeed, a wide variety of devices that in one way or another modulate light to measure the strength of an electric signal may be used. Therefore, the present examples and embodiments are to be considered as illustrative and not restrictive, and the invention is not to be limited to the details given herein, but may be modified within the scope of the appended claims.

We claim:

1. A test system that measures electrical properties of various devices, the test system including a test head having first and second sides and comprising:
    a test platform being exposed on the first side of the test head;
    driving means for inputting high frequency electrical signals to the device under test for causing the device under test to perform particular tasks;
    an adapter board supported by said test platform and electrically communicating with the driving means for coupling contacts of a device under test to the driving means, wherein the test platform supports the adapter board on the first end of the test platform to facilitate removal of the adapter board and coupling the test head to various devices; and
    receiver means including an electro-optic sensor that modulates light in response to the electrical field applied thereto for measuring the electrical signals presented at specific locations on the device under test in response to the inputted signals, and optical means for directing light towards the electro-optic sensor wherein the electro-optic sensor is disposed adjacent the adapter board, there being an optical channel between the optical means and the electro-optic sensor.

2. A test system as recited in claim 1 wherein the electro-optic sensor is located within 1.0 cm of the device under test.

3. A test system as recited in claim 1 wherein the receiver mean is arranged to insure that the pin capacitance of the receiving means is less than 5 picofarads.

4. A test system as recited in claim 1 wherein said driving means includes a plurality of pin driver boards located radially about the test platform to minimize the distance between the device under test and the pin driver boards, each said pin driver board having an associated electrical transmission line that extends across the test platform.

5. A test system as recited in claim 4 wherein each said transmission line has an associated transmission path on the adapter board for transmitting electrical signals from the associated pin driver board to one of the contacts on the device under test and thereafter to ground, the test head further comprising connector means for electrically coupling said transmission lines to said transmission paths wherein each said transmission line and its associated said transmission path and said connector means combine to form an electrical transmission channel between an associated pin driver board and an associated contact on said device under test, and wherein said transmission channels have substantially equal impedance to maintain signal integrity.

6. A test system as recited in claim 5 wherein each said matched transmission channel has an impedance of less than approximately 100 ohms.

7. A test system as recited in claim 1 wherein the device under test is an integrated circuit.

8. A test system as recited in claim 1 wherein the device under test is a semiconductor wafer.

9. A test system as recited in claim 1 wherein the device under test is a printed circuit board.

10. A test system as recited in claim 1 wherein the device under test is a hybrid electrical circuit.

11. A test system as recited in claim 1 wherein said driving means delivers signals having a frequency higher than 500 MHz.

12. A test system as recited in claim 1 further comprising cooling means for maintaining said pin driving means at a substantially constant temperature during operation to minimize pin driver timing drift.

13. A test system as recited in claim 1 wherein said optical channel is located centrally of the radially arranged pin driver boards.

14. A high speed test system for testing electronic properties of a device under test comprising:
   a test platform for receiving a device under test;
   pin driving means for imputting high frequency electronic signals to the device under test for causing the device under test to perform particular tasks;
   an adapter board supported by said test platform and electrically communicating with the pin driving means for coupling contacts of a device under test to the pin driving means,
   receiver means including an electro-optic sensor that modulates light in response to the electrical field applied thereto for measuring the electrical signals presented at specific locations on the device under test in response to the inputted signals, wherein the receiver is located within 1.0 cm of the device under test to minimize pin capacitance.

15. A high speed test system for testing electronic properties of a device under test comprising:
   a test platform for receiving a device under test;
   pin driving means for imputting high frequency electronic signals to the device under test for causing the device under test to perform particular tasks;
   an adapter board supported by said test platform and electrically communicating with the pin driving means for coupling contacts of a device under test to the pin driving means,
   receiver means including an electro-optic sensor that modulates light in response to the electrical field applied thereto for measuring the electrical signals presented at specific locations on the device under test in response to the inputted signals, wherein the receiver is arranged to insure that the pin capacitance of the receiving means is less than 5 picofarads.

16. A test system that measures electrical properties of various devices, the test system including a test head having first and second sides and comprising:
   a test platform for receiving a device under test, the test platform being exposed on the first side of the test head;
   pin driving means for inputting high frequency electrical signals to the device under test for causing the device under test to perform particular tasks, the pin driving means including a plurality of pin driver boards positioned radially about the test platform to minimize the distance between the device under test and the pin driver boards, each said pin driver board having an associated electrical transmission line that extends across the test platform, the radially arranged pin driver boards having a longitudinal axis;
   an adapter board supported by said test platform and electrically communicating with the driving means for coupling contacts of a device under test to the driving means, wherein the test platform supports the adapter board on the first end of the test platform to facilitate removal of the adapter board and coupling the test head to various devices;
   receiver means including an electro-optic sensor that modulates light in response to the electrical field applied thereto for measuring the electrical signals presented at specific locations on the device under test in response to the inputted signals, and optical means for directing light towards the electro-optic sensor, the optical means having an optical transmission path, and wherein the electro-optic sensor and the optical transmission path are located central of the pin driver boards substantially aligned with said longitudinal axis, and the electro-optic sensor is located within 1.0 cm of the device under test to minimize pin capacitance, the pin capacitance of the receiving means being less than 5 picofarads; and
   cooling means for maintaining said pin driving means at a substantially constant temperature during operation to minimize pin driver timing drift.

17. A test system as recited in claim 16 wherein each said transmission line has an associated transmission path on the adapter board for transmitting electrical signals from the associated pin driver board to one of the contacts on the device under test and thereafter to ground, the test head further comprising connector means for electrically coupling said transmission lines to said transmission paths wherein each said transmission line and its associated said transmission path and said connector means combine to form an electrical transmission channel between an associated pin driver board and an associated contact on said device under test, and wherein said transmission channels have substantially equal impedance to maintain signal integrity.

18. A test system as recited in claim 17 wherein each said matched transmission channel has an impedance of less than approximately 100 ohms.

19. A test system as recited in claim 18 wherein the device under test is an integrated circuit.

20. A test system as recited in claim 1 wherein the device under test is a semiconductor wafer.

21. A test system as recited in claim 16 wherein said driving means delivers signals having a frequency higher than 500 MHz.

22. A test system as recited in claim 16 wherein cooling means include a cooling plate that is thermally coupled to said pin driver boards, said cooling plate including a liquid conduit for passing a coolant fluid through the cooling plate.

23. A test system as recited in claim 22 wherein said cooling means further includes:
   a plurality of conducting plates, each said pin driver board being supported by one of said conducting plate; and
   connection means for coupling said conducting plates to said cooling plate, the conducting plates and said connection means providing good thermal contact between said pin driver boards and said cooling plate.

* * * * *